(12) United States Patent
Campbell et al.

(10) Patent No.: US 7,274,566 B2
(45) Date of Patent: Sep. 25, 2007

(54) COOLING APPARATUS FOR AN ELECTRONICS SUBSYSTEM EMPLOYING A COOLANT FLOW DRIVE APPARATUS BETWEEN COOLANT FLOW PATHS

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 11/008,732

(22) Filed: Dec. 9, 2004

(65) Prior Publication Data

US 2006/0126293 A1 Jun. 15, 2006

(51) Int. Cl.
*H05K 7/20* (2006.01)
*F04B 17/00* (2006.01)

(52) U.S. Cl. .................. 361/699; 165/80.4; 417/423.1; 417/424.1

(58) Field of Classification Search ............... None
See application file for complete search history.

(56) References Cited

U.S. PATENT DOCUMENTS

| | | | |
|---|---|---|---|
| 5,039,286 A * | 8/1991 | Point et al. ............... 417/424.1 |
| 5,131,233 A | 7/1992 | Cray et al. ..................... 62/64 |
| 5,218,515 A * | 6/1993 | Bernhardt .................... 361/689 |
| 5,924,482 A | 7/1999 | Edwards et al. ......... 165/104.33 |
| 6,019,165 A | 2/2000 | Batchelder ................. 165/80.3 |
| 6,305,180 B1 * | 10/2001 | Miller et al. ................ 62/259.2 |
| 6,393,853 B1 * | 5/2002 | Vukovic et al. ............ 62/259.2 |
| 6,408,937 B1 | 6/2002 | Roy ....................... 165/104.33 |
| 6,498,725 B2 | 12/2002 | Cole et al. .................... 361/700 |
| 6,580,609 B2 * | 6/2003 | Pautsch ....................... 361/698 |
| 6,587,345 B2 | 7/2003 | Chu et al. .................... 361/719 |
| 6,604,370 B2 | 8/2003 | Bash et al. .................... 62/171 |
| 6,604,571 B1 | 8/2003 | Morrow et al. ........ 165/104.21 |
| 6,625,023 B1 | 9/2003 | Morrow et al. ............. 361/700 |
| 6,628,520 B2 * | 9/2003 | Patel et al. .................. 361/696 |

(Continued)

OTHER PUBLICATIONS

"MEMS-Based Heat Exchanger Cools 'Hot' CPUs," www.graniteve.com, Granite Ventures, LLC, Sep. 29, 2003 (3 pgs.).

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti, P.C.

(57) ABSTRACT

A coolant flow drive apparatus is provided for facilitating removal of heat from a cooling structure coupled to a heat generating electronics component. The coolant flow drive apparatus includes a turbine in fluid communication with a primary coolant flowing within a primary coolant flow loop, and a pump in fluid communication with a secondary coolant within a secondary coolant flow path. The secondary fluid flow path is separate from the primary coolant flow path. The flow drive apparatus further includes a magnetic coupling between the turbine and the pump, wherein the turbine drives the pump through the magnetic coupling to pump secondary coolant through the secondary coolant flow path.

20 Claims, 8 Drawing Sheets

U.S. PATENT DOCUMENTS

| | | | | |
|---|---|---|---|---|
| 6,991,024 | B2* | 1/2006 | Goodson et al. | 165/80.4 |
| 7,104,312 | B2* | 9/2006 | Goodson et al. | 165/80.4 |
| 7,131,486 | B2* | 11/2006 | Goodson et al. | 165/80.4 |
| 7,184,269 | B2* | 2/2007 | Campbell et al. | 361/700 |
| 2003/0072656 | A1 | 4/2003 | Niwatsukino et al. | 417/354 |
| 2004/0012914 | A1 | 1/2004 | Chu et al. | 361/679 |
| 2004/0123614 | A1 | 7/2004 | Stewart | 62/259.2 |
| 2005/0168079 | A1* | 8/2005 | Wos | 310/52 |
| 2006/0082970 | A1* | 4/2006 | Walz et al. | 361/699 |

OTHER PUBLICATIONS

Catalog, "Microstructure Liquid Cooler: Outstanding Cooling Performance for Electronic Devices," Atotech (2003) (6 pgs.).

Valenzuela, J.A., et al., "Cooling High Heat Flux Devices with *Mikros* Microchannel Heat Sinks," Mikros Manufacturing, Inc., Aug. 2003 (13 pgs).

Chu et al., "Thermal Dissipation Assembly and Fabrication Method for Electronics Drawer of a Multiple-Drawer Electronics Rack," U.S. Appl. No. 10/675,628, filed Sep. 30, 2003.

Chu et al., "Cooling System and Method Employing At Least Two Modular Cooling Units for Ensuring Cooling of Multiple Electronics Subsystems," U.S. Appl. No. 10/726,377, filed Dec. 13, 2003.

Chu et al., "Method System and Program Product for Automatically Checking Coolant Loops of a Cooling System for a Computing Environment," U.S. Appl. No. 10/736,944, filed Dec. 16, 2003.

Chu et al., "Method System and Program Product for Monitoring Rate of Volume Change of Coolant Within a Cooling System," U.S. Appl. No. 10/736,947, filed Dec. 16, 2003.

Campbell et al., "Cooling System and Method Employing Auxiliary Thermal Capacitor Unit for Facilitating Continuous Operation of an Electronics Rack," U.S. Appl. No. 10/930,079, filed Aug. 31, 2004.

* cited by examiner fig. 1 fig. 2 fig. 3 fig. 4 fig. 5 fig. 6 fig. 7 fig. 8A fig. 8B fig. 8C fig. 8D fig. 8E

COOLING APPARATUS FOR AN ELECTRONICS SUBSYSTEM EMPLOYING A COOLANT FLOW DRIVE APPARATUS BETWEEN COOLANT FLOW PATHS

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Cooling System and Method Employing a Closed Loop Coolant Path and Micro-Scaled Cooling Structure Within an Electronics Subsystem of an Electronics Rack," Campbell et al., Ser. No. 11/008,711 filed Dec. 9, 2004 herewith;

"Cooling Apparatus and Method for an Electronics Module Employing an Integrated Heat Exchange Assembly," Campbell et al., Ser. No. 11/008,711 filed Dec. 9, 2004 co-filed herewith; and "Electronic Device Substrate Assembly With Multi-Layer Impermeable Barrier and Method of Making," Chu et al., Ser. No. 10/197,661, filed Jul. 17, 2002, and published as U.S. Publication No. US 2004/0812914 A1, on Jan. 22, 2004.

TECHNICAL FIELD

The present invention relates to cooling apparatuses and methods for removing heat generated by electronics devices, modules and systems, and to methods of constructing such cooling apparatuses. More particularly, the present invention relates to cooling apparatuses and methods for extracting heat from heat generating components of one or more electronics subsystems of one or more electronics racks.

BACKGROUND OF THE INVENTION

As is known, operating electronic devices produce heat. This heat should be removed from the devices in order to maintain device junction temperatures within desirable limits. Failure to remove the heat thus produced results in increased device temperatures, potentially leading to thermal runaway conditions. Several trends in the electronics industry have combined to increase the importance of thermal management, including heat removal for electronics devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. Additionally, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. A problem with this configuration is the increase in heat flux at the electronics drawer level. The above-noted trends have combined to create applications where it is no longer desirable to remove heat from modern devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling liquid. As is known, different liquids provide different cooling capabilities. In particular, liquids such as refrigerants or other dielectric fluids (e.g., fluorocarbon fluid) exhibit relatively poor thermal conductivity and specific heat properties, i.e., when compared to liquids such as water or other aqueous fluids. Dielectric liquids have an advantage, however, in that they may be placed in direct physical contact with electronic devices and interconnects without adverse affects such as corrosion or electrical short circuits. For example, U.S. Pat. No. 6,052,284, entitled "Printed Circuit Board with Electronic Devices Mounted Thereon", describes an apparatus in which a dielectric liquid flows over and around several operating electronic devices, thereby removing heat from the devices. Similar approaches are disclosed in U.S. Pat. No. 5,655,290, entitled "Method for Making a Three-Dimensional Multi-chip Module" and U.S. Pat. No. 4,888,663, entitled "Cooling System for Electronic Assembly".

Other cooling liquids, such as water or other aqueous fluids, exhibit superior thermal conductivity and specific heat compared to dielectric liquids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages", discloses the use of a conductive foil barrier; U.S. Pat. No. 4,879,629, entitled "Liquid Cooled Multi-chip Integrated Circuit Module Incorporating A Seamless Compliant Member for Leakproof Operation", and IBM Technical Disclosure Bulletin Vol. 20, No. 2, July 1977, entitled "Liquid Cooled Module with Compliant Membrane", disclose the use of a flexible barrier with thermal conduction enhancements (thermal studs and heatsinks, respectively); and U.S. Pat. No. 4,381,032, entitled "Apparatus for Cooling High-Density Integrated Circuit Packages", and U.S. Pat. No. 5,294,830, entitled "Apparatus for Indirect Impingement Cooling of Integrated Circuit Chips", disclose the use of flexible barriers, where pistons are used to maintain contact between the barrier and the devices to be cooled. The above-incorporated, co-pending patent application entitled "Electronic Device Substrate Assembly With Mulilayer Impermeable Barrier and Method of Making", describes an electronic device substrate assembly with a multilayer impermeable barrier which provides high effective thermal conductivity between a device to be cooled and a water-based coolant, while simultaneously maintaining physical separation between the coolant and electronic devices and minimizing mechanical stresses caused by mismatches in the thermal coefficients of expansion of various materials within the device assembly.

Notwithstanding the above, there remains a large and significant need to provide further useful cooling apparatus enhancements for facilitating cooling of electronic circuit devices such as electronic modules disposed, e.g., in a multi-drawer electronics rack.

SUMMARY OF THE INVENTION

The shortcomings of the prior art are overcome and additional advantages are provided through a coolant flow drive apparatus for a cooling system. The coolant flow drive apparatus includes a turbine in fluid communication with a primary coolant flowing within a primary coolant flow path, and a pump in fluid communication with a secondary coolant within a secondary coolant flow path. The secondary coolant flow path is separate from the primary coolant flow path. The coolant flow drive apparatus further includes a magnetic coupling between the turbine and the pump, wherein the turbine drives the pump through the magnetic coupling to pump secondary coolant through the secondary coolant flow path.

In another aspect, a cooling apparatus is provided. This cooling apparatus includes a primary coolant flow path and a separate, secondary coolant flow path. The secondary fluid flow path facilitates removal of heat to the primary coolant flow path from a cooling structure coupled to a heat generating electronic component. The cooling apparatus further includes a coolant flow drive apparatus coupled between the primary coolant flow path and the secondary coolant flow path. The coolant flow drive apparatus maintains isolation of primary coolant in the primary coolant flow path and the secondary coolant in the secondary coolant flow path, and transfers fluid flow energy from primary coolant flowing within the primary coolant flow path to the secondary coolant to pump the secondary coolant through the secondary coolant flow path.

In a further aspect, a cooled electronics system is provided. The cooled electronics system includes at least one electronics rack comprising a plurality of electronics subsystems, and a cooling apparatus for at least one electronics subsystem of the plurality of electronics subsystems. The cooling apparatus includes a primary coolant flow path and a separate, secondary coolant flow path. The secondary coolant flow path facilitates removal of heat to the primary coolant flow path from a cooling structure coupled to a heat generating electronics component within the at least one electronics subsystem. The cooling apparatus further includes a coolant flow drive apparatus coupled between the primary coolant flow path and the secondary coolant flow path. The coolant flow drive apparatus maintains isolation of the primary coolant in the primary coolant flow path and the secondary coolant in the secondary coolant flow path, and transfers fluid flow energy from primary coolant flowing within the primary coolant flow path to the secondary coolant to pump the secondary coolant through the secondary coolant flow path.

Methods of fabricating a cooling apparatus for an electronics subassembly and for fabricating a coolant flow drive apparatus are also presented.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating components requiring cooling. Each heat generating component may comprise an electronics device, an electronics module, an integrated circuit chip, etc. As used herein, "micro-scaled cooling structure" means a cooling structure with a characteristic dimension of 200 micrometers (microns) or less.

One example of coolant within a cooling system in accordance with an aspect of the present invention is water. However, the concepts disclosed herein are readily adapted to use with other types of coolant on the facility side, system side, and conditioned coolant side of the cooling system. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are again rising to a level where they no longer can be simply air cooled. The components will likely be water cooled. Heat dissipated by the processor can be transferred to water via a water cooled cold plate. Facility water typically available at customer locations (i.e., data centers) is not suitable for use in these cold plates. First, condensation formation is a concern as the temperature of the data center water, ranging from 7° C. to 15° C., is far below the room dew point (typically 18-23° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant" refers to cooled/conditioned coolant circulating between a coolant distribution unit and the electronics subsystems to be cooled, and "conditioned coolant" refers to coolant circulating within a given electronics subsystem.

Figure 1:
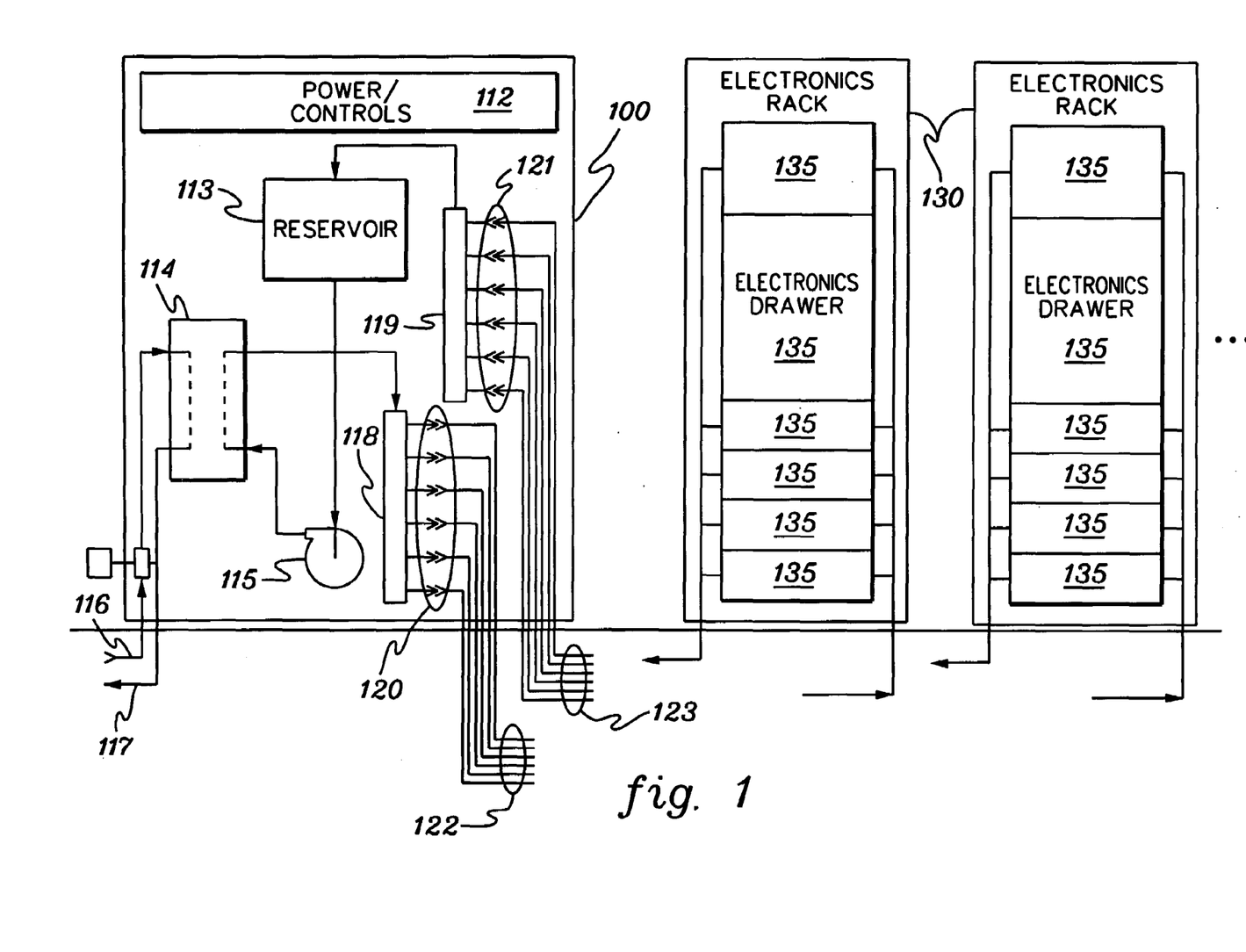
FIG. 1 is a conventional coolant distribution unit, such as a computer room water conditioning unit (CRWCU), for cooling one or more electronics racks of a computing environment.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies more than what would now be considered as two full electronics frames. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
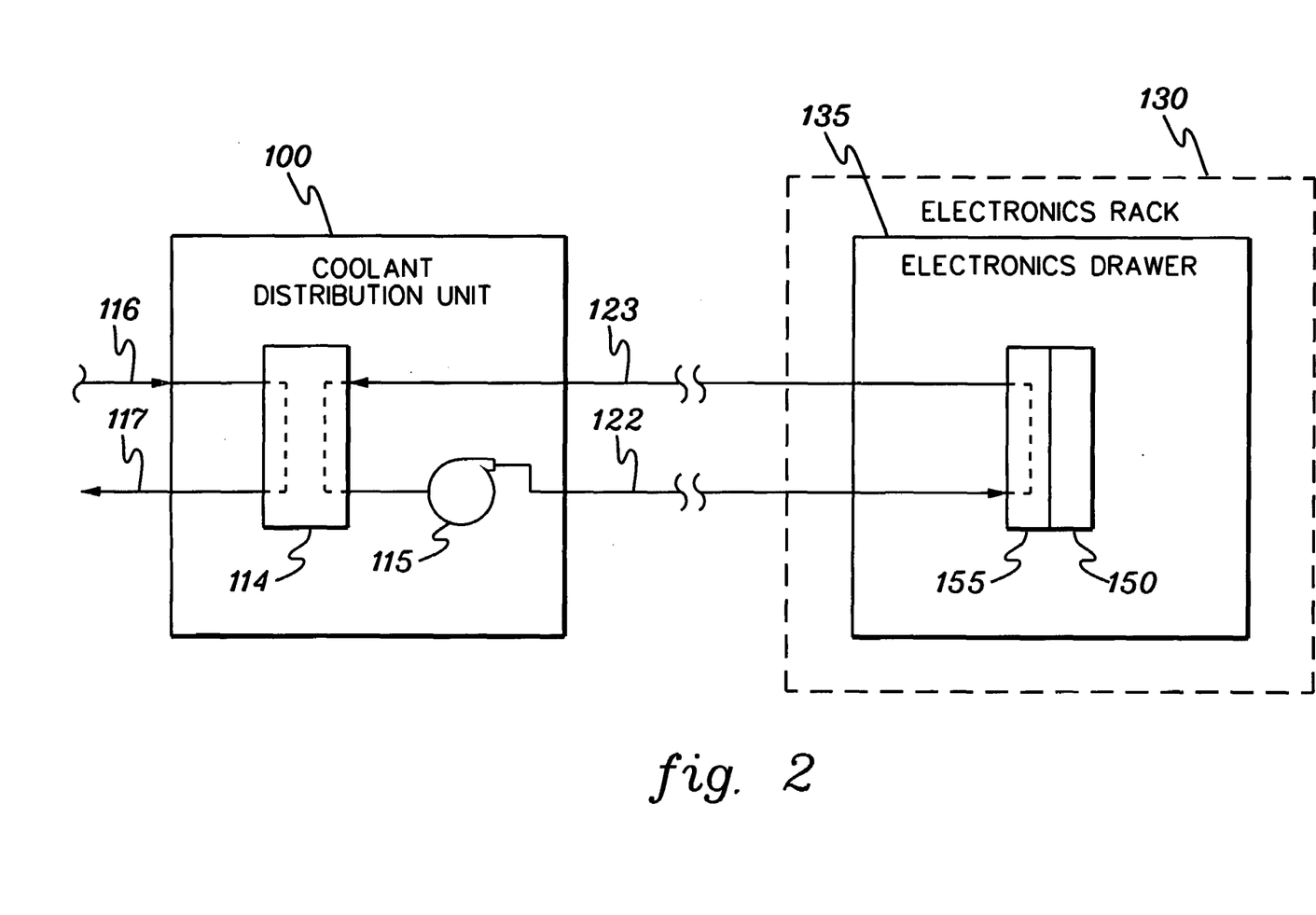
FIG. 2 is a schematic of one embodiment of an electronics drawer of an electronics rack and a cooling system therefor employing a conventional coolant distribution unit with a facility coolant loop and a system coolant loop.

FIG. 2 schematically illustrates operation of the cooling system of FIG. 1, wherein a liquid cooled cold plate 155 is shown coupled to an electronics module 150 of electronics drawer 135 within electronics rack 130. Heat is removed from electronics module 150 via the system coolant, which is pumped via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred. Filtration has not been required in a system such as depicted in FIG. 2 since the system coolant loop has characteristic dimensions for fluid flow that are sufficiently large to allow residual particulate debris to flow freely through the loop. For example, a cold plate with 1.65 mm wide channels was employed in the ES/9000 system offered by International Business Machines Corporation of Armonk, N.Y.

As noted, processor power levels continue to rise as designers push for ever increasing computing performance. Electronic module power levels are expected to go well beyond conventional air cooling technologies, and even beyond conventional liquid cooling cold plate concepts. To address these future cooling needs, micro-scaled cooling structures are being developed. Two examples of such structures are marketed by Mikros Manufacturing, Inc., of Claremont, N.H. and ATOTECH of Berlin, Germany. Other examples of micro-scaled cooling structures are also available in the art. These micro-scaled structures have a characteristic dimension more than an order of magnitude less than the cold plates previously employed. Further, the micro-scaled cooling structures have a minimum dimension on the order of or smaller than particulates that regularly circulate through the system coolant of a cooling system such as depicted in FIGS. 1 & 2. In available structures, the characteristic dimension of micro-scaled structures currently ranges from 50 to 100 micrometers (microns), and could be further reduced as the technology matures. At these small width scales, fluid cleanliness is imperative. At such dimensions, the micro-scaled cooling structure could act more like a filter than a heat sink, thereby inhibiting cooling.

One solution to the problem would be to introduce a filter into the system coolant side of the cooling assembly of FIGS. 1 & 2. This, unfortunately, would be undesirable because it would add additional pressure drop and would require continuing maintenance. Thus, in one aspect, an objective of the present invention is to create an isolated subassembly associated with the electronics subsystem which is in thermal contact with the system coolant loop and which is designed and manufactured to accommodate the micro-scale aspects of a micro-scaled cooling structure.

Figure 3:
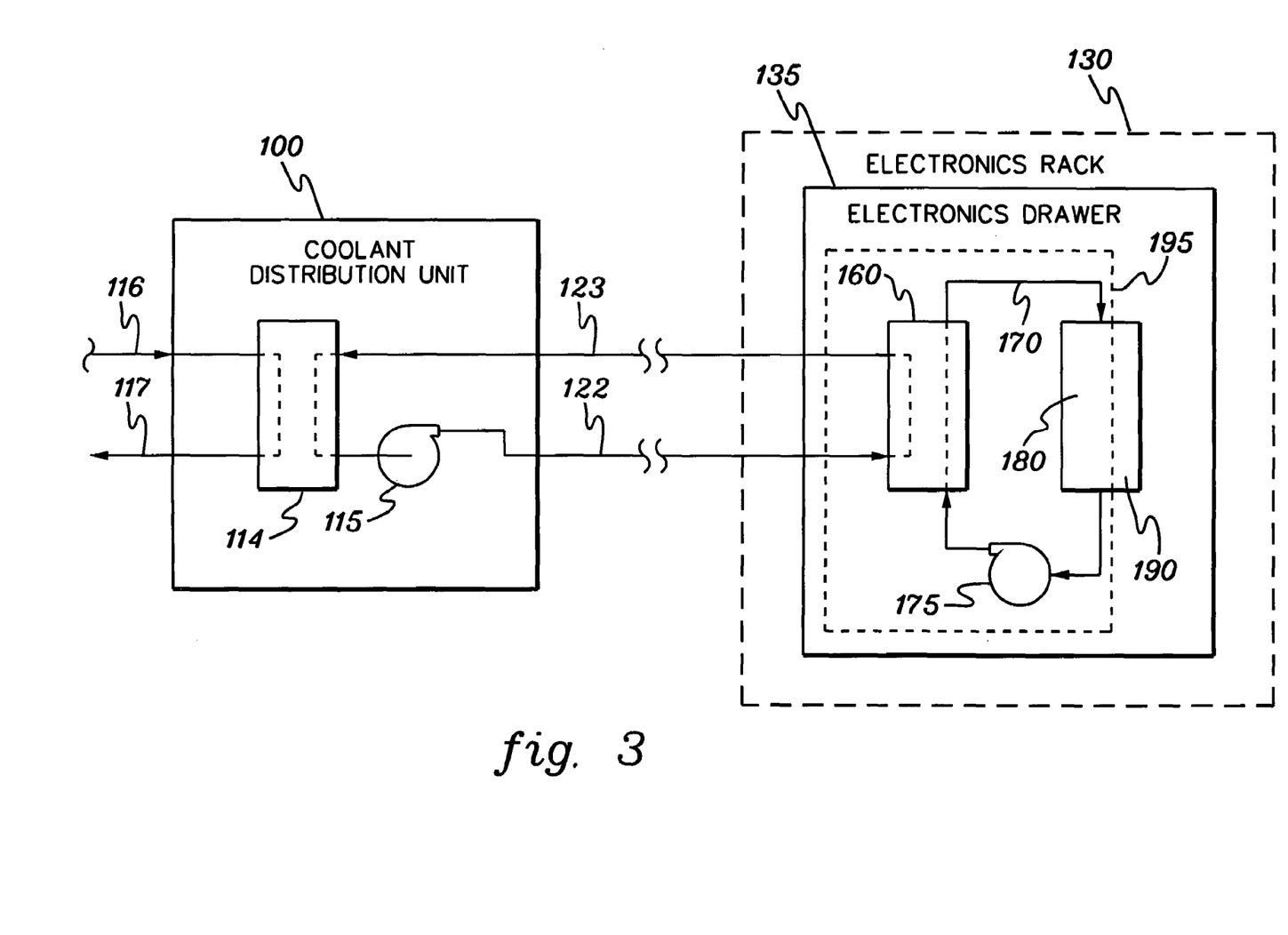
FIG. 3 is a schematic of one embodiment of a cooling system for an electronics subsystem of an electronics rack, which includes a coolant distribution unit and a thermal dissipation unit comprising a conditioned coolant loop within the electronics subsystem, in accordance with an aspect of the present invention.

FIG. 3 depicts one embodiment of a cooling system accomplishing this objective. This cooling system or apparatus includes a coolant distribution unit 100 and one or more thermal dissipation units 195. Each thermal dissipation unit 195 is associated with a respective electronics subsystem or drawer 135 of an electronics rack 130 of the computing environment. The coolant distribution unit 100 again includes a first heat exchanger 114, a first cooling loop 116, 117, and one or more second cooling loops 122, 123. The first cooling loop 116, 117 receives facility coolant and passes at least a portion thereof through the first heat exchanger 114. Each second cooling loop provides system coolant to at least one electronics subsystem 135 and expels heat in the first heat exchanger 114 from electronics subsystem 135 to the facility coolant in the first cooling loop 116, 117. System coolant is circulated within the second cooling loop 122, 123 via a pump 115.

Each thermal dissipation unit 195 is associated with a respective electronics subsystem 135, and includes a second heat exchanger 160, a second cooling loop 122, 123 of the one or more second cooling loops, a third cooling loop 170, and a micro-scaled cooling structure 180. The second cooling loop provides system coolant to the second heat exchanger 160, and the third cooling loop circulates conditioned coolant within the at least one electronics subsystem through the micro-scaled cooling structure 180 and expels heat in the second heat exchanger 160 from a heat generating component 190 (e.g., electronics module) of the electronics subsystem 135. The heat is expelled in the heat exchanger to the system coolant in the second cooling loop 122, 123.

Conditioned coolant circulates via a pump 175 through the third cooling loop 170 of the thermal dissipation unit 195. In one example, the third cooling loop is a closed loop fluid path, thereby minimizing the opportunity for particulate to enter the cooling loop once the conditioned coolant has been filtered as described below.

Advantageously, the third cooling loop is physically isolated from the system coolant of the cooling assembly. The third cooling loop is a separate, dedicated loop or subassembly localized to the electronics subsystem, and to, more particularly, the one or more heat generating components, such as an electronic module thereof, that is to be cooled. The third cooling loop and associated components comprise a subassembly that is manufactured to create a pristine environment from both a particulate and materials compatibility (i.e., corrosion) viewpoint. The cooling subassembly 195 is designed to be a closed system once operational (i.e., a system that is not opened in the field). Being a closed subsystem in the field, particulate contamination can be managed during assembly.

Those skilled in the art will note that provided herein is a cooling assembly which employs three distinct cooling loops. A first cooling loop and a second cooling loop are associated with a coolant distribution unit which includes a fluid-to-fluid heat exchanger to allow the transfer of heat from system coolant within the second cooling loop to facility coolant within the first cooling loop. One or more thermal dissipation units or cooling subassemblies are associated with one or more electronics subsystems of, for example, an electronics rack. Each thermal dissipation unit includes a respective second cooling loop and a third cooling loop, which in one example, comprises an isolated, closed loop flow path. The thermal dissipation unit further includes a second fluid-to-fluid heat exchanger which allows heat to be expelled from conditioned coolant within the third cooling loop to the system coolant within the second cooling loop for transfer to the coolant distribution unit. Advantageously, by separating the conditioned coolant, system coolant and facility coolant, each coolant loop can have coolant of different properties or characteristics. These different characteristics can include different:

Coolant purity—which allows the use of higher purity coolant within the third cooling loop, less pure coolant within the system coolant loop, and still less pure coolant within the facility coolant loop. High purity coolant is desirable in the third cooling loop of the thermal dissipation unit, particularly when used with small-scale cooling structures (i.e., channels, nozzles, orifices, fins, etc.) to prevent contaminants from interfering with operation of, for example, a micro-scaled cooling structure.

Coolant pressure—which allows, for example, conditioned coolant within the third cooling loop to be at a pressure below atmospheric pressure, while system coolant and facility coolant in the second cooling loop and the first cooling loop remain at or above atmospheric pressure. This allows, for example, the conditioned coolant to have a different boiling point than the system coolant.

Coolant phase change—the third cooling loop allows a conditioned coolant to be employed in a two-phase cooling approach, while maintaining the system coolant and facility coolant as single-phase coolants.

Coolant flow rate—which may be related to different pressures and phase change temperatures of the various coolants in the cooling system. Further, it may be desirable to employ a lower flow rate through the micro-scaled cooling structure than the flow rate through, for example, the second cooling loop containing the system coolant.

Coolant chemistry—which allows different coolant fluid chemistries to be employed in the various cooling loops of the cooling system. For example, water could be employed in the first and second cooling loops as both the facility coolant and the system coolant, only of different purity, while the third cooling loop may employ a dielectric as the conditioned coolant. This may be advantageous, for example, in an embodiment where the conditioned coolant directly contacts one or more integrated circuit chips of the electronics subsystem being cooled.

Various approaches to coupling a cooling structure to one or more heat generating components of an electronics assembly are described in the above-incorporated U.S. Patent Applications entitled "Cooling System and Method Employing a Closed Loop Coolant Path and Micro-Scaled Cooling Structure Within an Electronic Subsystem of an Electronics Rack," and "Cooling Apparatus and Method for an Electronics Module Employing an Integrated Heat Exchange Assembly." Presented herein are various enhanced cooling apparatuses, wherein a coolant flow drive apparatus is employed to transfer fluid energy from a primary coolant flow path (e.g., the second or system coolant cooling loop) to a secondary coolant flow path (e.g., the third or conditioned coolant cooling loop).

As noted initially, as microprocessor chip heat fluxes increase due to more compact electronic designs, aggressive heat removal devices are needed to dissipate the generated heat. These heat removal devices may employ micro-scaled structures which have a small characteristic dimension of, for example, less than 200 micrometers (microns). Since these micro-scaled structures are extremely sensitive to fouling, clogging, corrosion, etc., it is necessary to ensure a pure, uncontaminated, and particle free flow of coolant to the heat removal device. One solution to the problem is set forth in FIG. 3 discussed above wherein a separate, closed loop fluid path 170 is provided to separate ultra-pure coolant, i.e., conditioned coolant, used within the micro-scaled cooling structure from the system coolant or the facility coolant used as the sink for dissipated heat. Within such an environment, it is believed desirable to also drive the ultra-clean conditioned coolant loop using fluid power generated in the system coolant loop, rather than introduce a separately powered pump into the ultra-pure conditioned coolant loop.

Thus, in one aspect, a cooling apparatus in accordance with the present invention includes a coolant flow drive apparatus disposed between a primary coolant loop (i.e., primary coolant flow path) and a secondary coolant loop (i.e., secondary coolant flow path). The coolant flow drive apparatus extracts flow energy (seen by the primary coolant loop as a pressure drop), and imparts this energy via a centrifugal pump to the ultra-clean, secondary coolant loop passing through, e.g., a micro-scaled cooling structure. The primary coolant flow power is converted to rotational work and is transferred to a magnetic coupling, which operates separated by a non-magnetic center chassis. The center chassis completely separates the primary coolant and the secondary coolant. Finally, the rotational work is converted to flow power in the ultra-pure secondary coolant loop.

Figure 4:
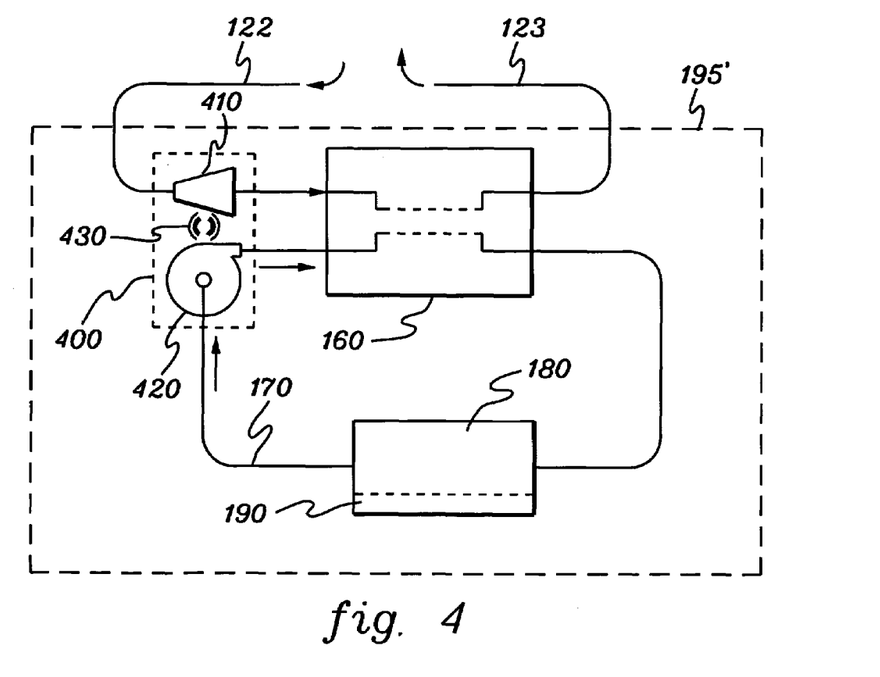
FIG. 4 is a schematic of one partial embodiment of a cooling apparatus for an electronics subsystem of an electronics rack, which employs a coolant flow drive apparatus between coolant flow paths, in accordance with an aspect of the present invention.

FIG. 4 depicts one embodiment of a thermal dissipation unit 195' employing a coolant flow drive apparatus 400, in accordance with this aspect of the present invention. The system coolant in system coolant loop 122, 123 is one example of a primary coolant supplied to thermal dissipation unit 195'. Thermal dissipation unit 195' further includes a conditioned coolant loop 170, which is one example of a secondary coolant loop. The thermal dissipation unit 195' further includes a heat exchanger 160 and a micro-scaled cooling structure 180 coupled to a heat generating component 190 (e.g., electronics module) of the electronics subsystem 135 (see FIG. 3). Heat is expelled in the heat exchanger from the conditioned coolant cooling loop 170 to the system coolant loop 122, 123. Conditioned coolant is circulated within cooling loop 170 via the coolant flow drive apparatus 400. In one example, the conditioned coolant loop 170 is a closed loop fluid path, thereby minimizing the opportunity for particulate to enter the cooling loop 170 once the conditioned coolant has been filtered, e.g., as described in the above-incorporated co-pending U.S. patent application entitled, "Cooling System and Method Employing a Closed Loop Coolant Path and Micro-Channel Cold Plate Within an Electronics Subsystem of an Electronics Rack." As shown in FIG. 4, coolant flow drive apparatus 400 includes a turbine 410 and a pump 420 which are magnetically coupled 430. In this implementation, the primary, system coolant provides both the thermal sink (via the heat exchanger) and the impetus for flow (via the coolant flow drive apparatus) for the secondary, conditioned coolant cooling loop.

Figure 5:
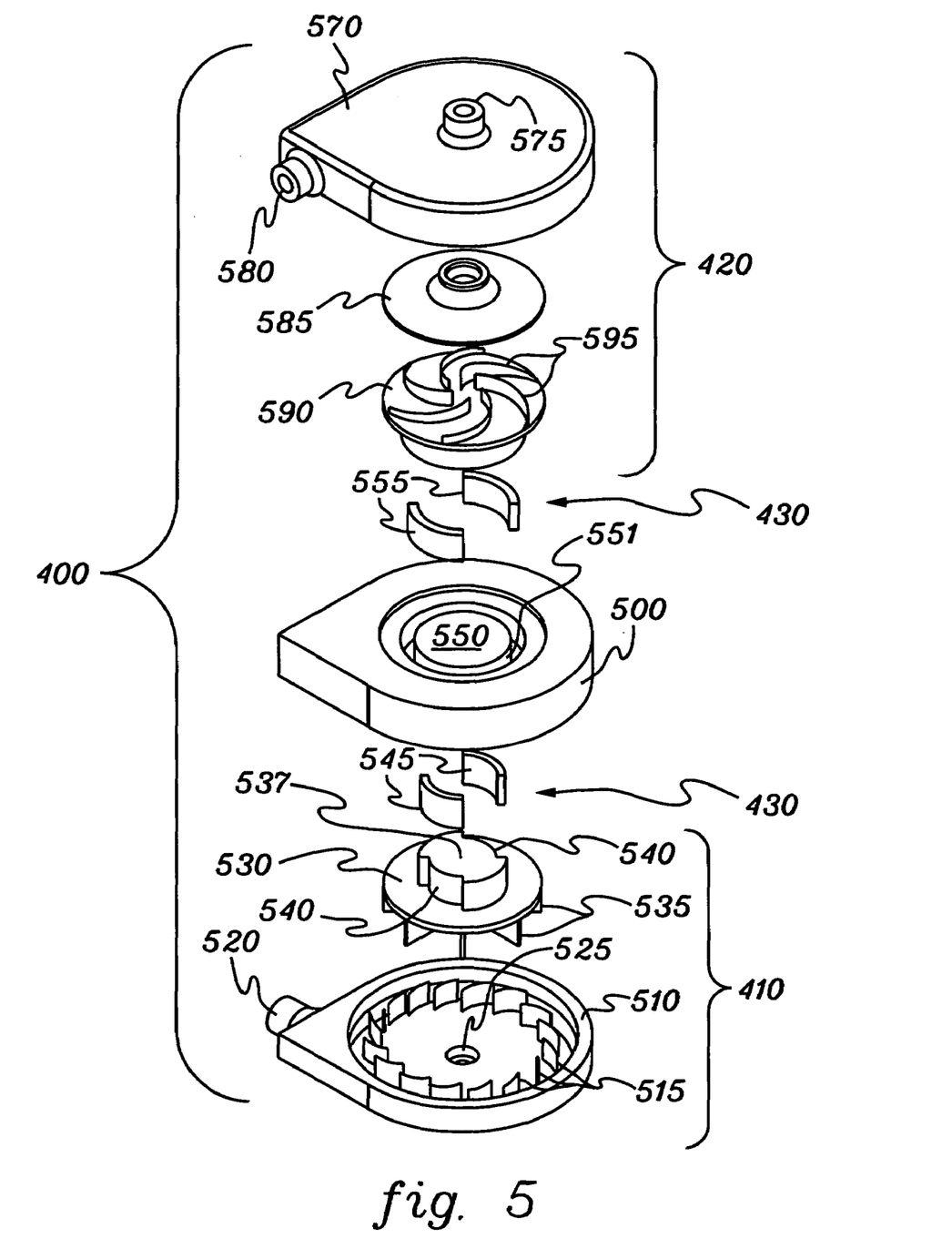
FIG. 5 is an exploded isometric view of one embodiment of a coolant flow drive apparatus for transferring energy between isolated coolants of a cooling apparatus, in accordance with an aspect of the present invention.
Figure 6:
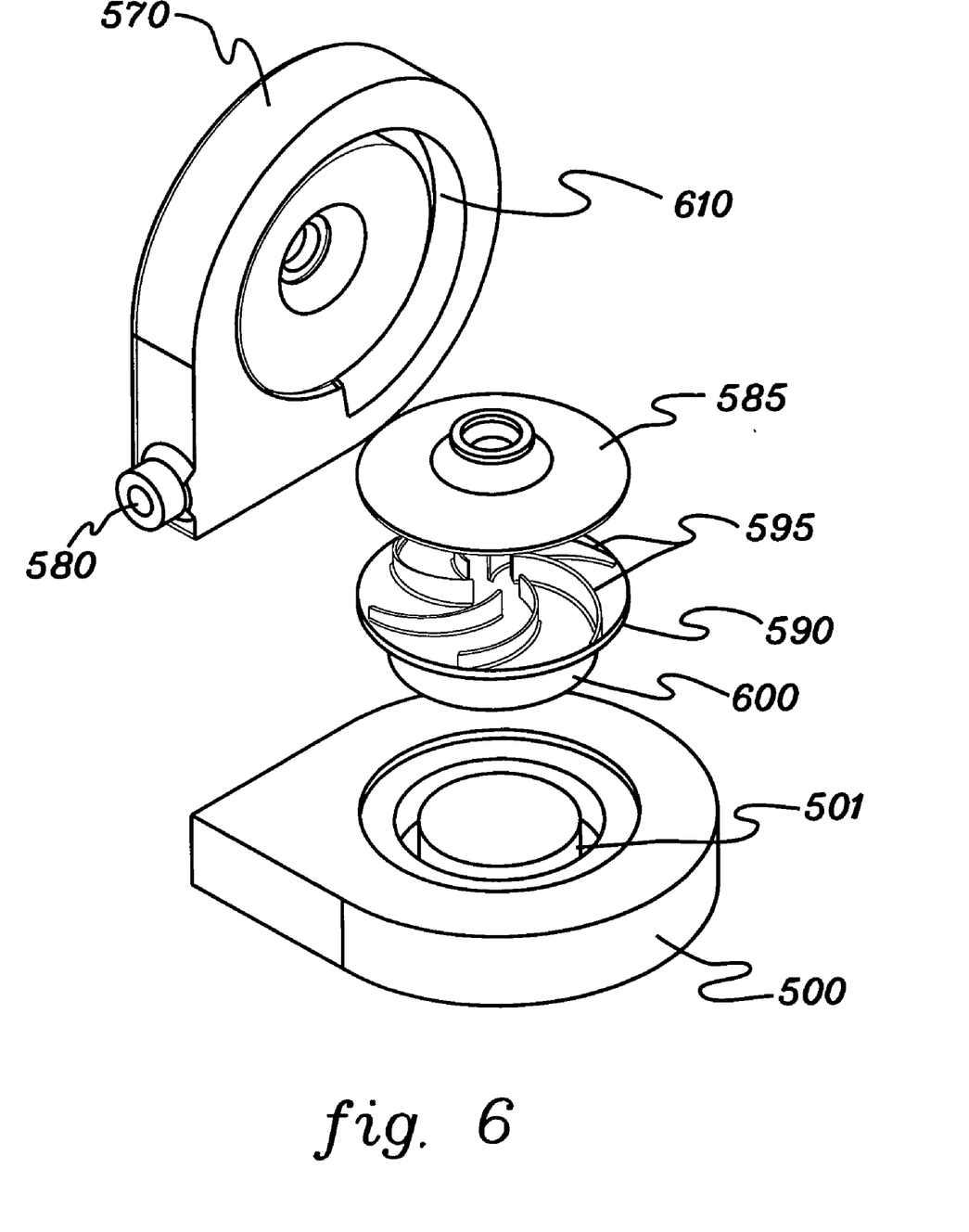
FIG. 6 is an exploded isometric view of the centrifugal pump and center chassis structures of the coolant flow drive apparatus of FIG. 5, in accordance with an aspect of the present invention.
Figure 7:
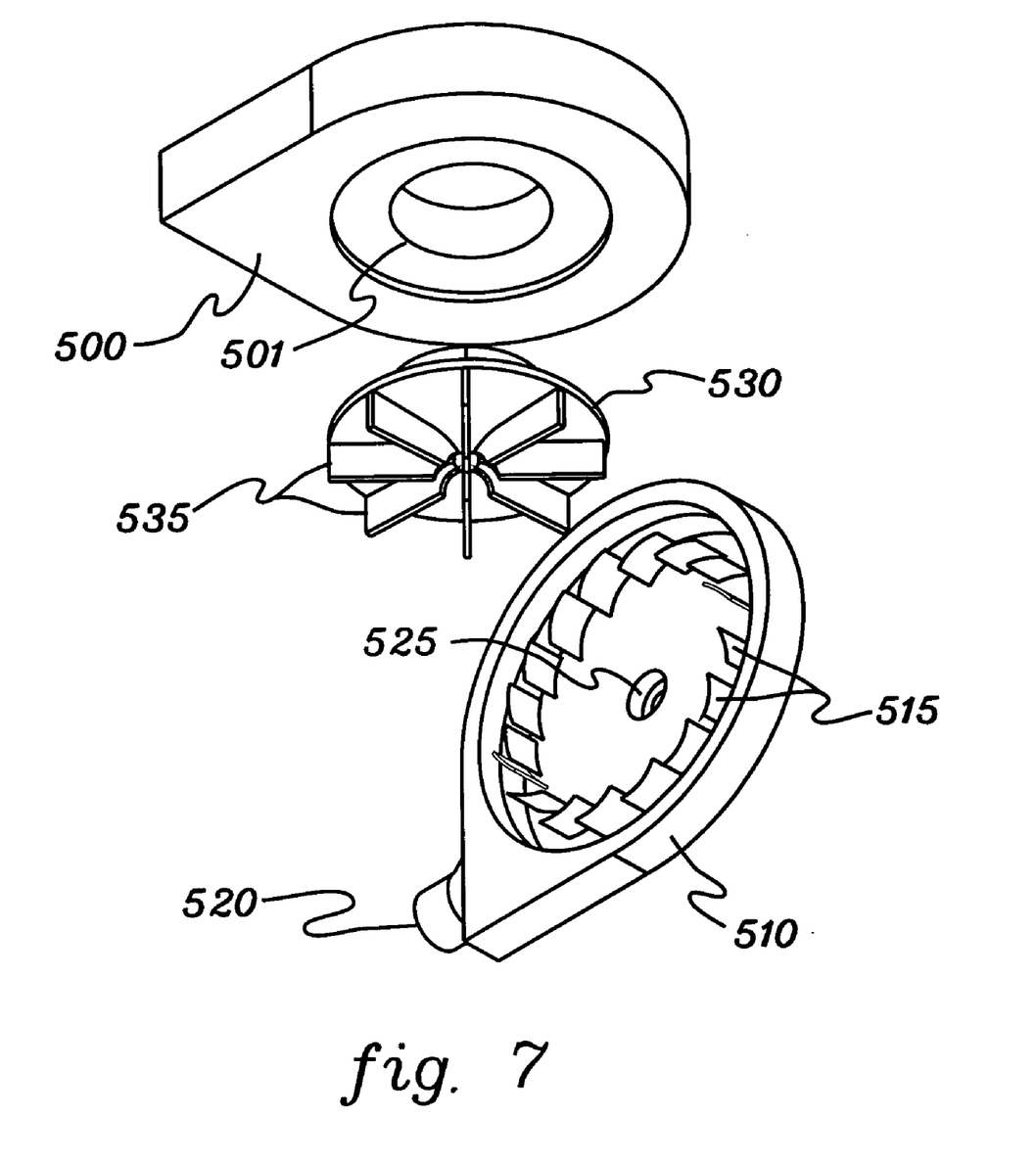
FIG. 7 is an exploded isometric view of the center chassis and radial flow turbine of the coolant flow drive apparatus of FIG. 5, in accordance with an aspect of the present invention.

FIGS. 5-7 depict exploded isometric views of one embodiment of a coolant flow drive apparatus 400, in accordance with an aspect of the present invention. Apparatus 400 is a magnetically coupled turbine/pump apparatus which transfers fluid power from a primary coolant flow path to fluid flow power in a secondary coolant flow path. Advantageously, although seals are required to prevent leakage from the pump impeller cover and from the turbine cover to the surroundings, note that no seals are necessary to separate the coolant flow in the turbine section from the coolant flow in the pump section since the intermediate member, i.e., center chassis, is a solid uninterrupted structure.

As shown in FIGS. 5 & 7, turbine 410 is in one embodiment a hydraulic radial flow turbine and includes a turbine cover 510 having turbine guide vanes 515 arranged on an inner surface thereof. A turbine impeller section 530 includes impeller blades 535 and a central turbine hub 537, which is pre-formed with magnet receiving areas 540 for receiving respective permanent magnets 545 of the magnetic coupling 430. Coolant flows into turbine cover 510 via an inlet 520 and is output through a centrally located outlet 525. Functionally, turbine section 410 is a hydraulic radial flow turbine, such as a Francis Turbine. As shown in FIG. 7, center chassis 500 includes a magnetic coupling region 501 where the turbine side permanent magnets 545 rotationally, magnetically couple to pump side permanent magnets 555 on the opposite side of center chassis 500 in magnetic coupling region 501 (see FIGS. 5 & 6). Note that the magnetic coupling region 501 on the turbine side of the center chassis is a circular pocket in which the turbine hub 537 resides during normal operation. Note also, that center chassis 500 includes a thin, solid region in the magnetic coupling region. This allows the permanent magnets 545 on the turbine hub to be in close proximity to the pump magnets 550 on the pump hub, without creating any potential leakage sites that might allow the primary coolant to contaminate the ultra-clean secondary coolant flow. Since the permanent magnets 545, 555 are separated by the thin, solid center chassis region, the turbine/pump apparatus is "seal-less" at the interface between the turbine and the pump.

One embodiment of pump section 420 is depicted in FIGS. 5 & 6. In this embodiment, pump 420 is a centrifugal pump and includes a pump side cover 570 which has a volute 610 in the surface that surrounds pump impeller structure 590 and impeller cover 585. Pump impeller structure 590 includes impeller blades 595 and a hub 600 to accommodate hub 550 of center chassis 500. The pump side drive magnets 555 for rotational power coupling are integrated within the impeller hub 600 so that rotational power is transferred from the turbine section 410 to the pump section 420 via the magnetic couplings 430. The magnetic coupling region 501 on the pump side of the center chassis is a pocket in the shape of an annulus in which the impeller hub 600 resides during normal operation. Pump side cover 570 includes a secondary coolant inlet 575 and a secondary coolant outlet 580 as shown. Again, note that center chassis 500 presents an absolute, seal-less barrier to exchange of coolants between the primary coolant loop and the secondary coolant loop.

Figure 8A:
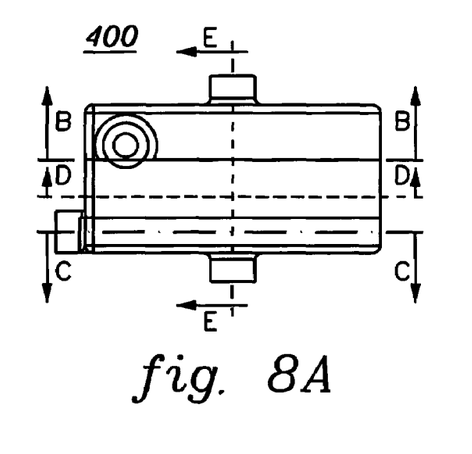
FIG. 8A is an elevational view of one embodiment of the assembled coolant flow drive apparatus of FIGS. 5-7, in accordance with an aspect of the present invention.

FIGS. 8A-8E depict the assembled coolant flow drive apparatus 400 of FIGS. 5-7. The assembled apparatus 400 is depicted in FIG. 8A, which includes view indications for the various cross-sectional views of FIGS. 8B-8E.

Figure 8B:
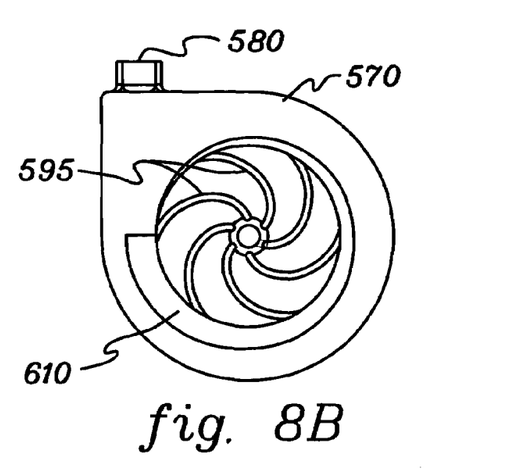
FIG. 8B is a cross-sectional elevational view of the assembled coolant flow drive apparatus of FIG. 8A, taken along lines B-B, in accordance with an aspect of the present invention.
Figure 8C:
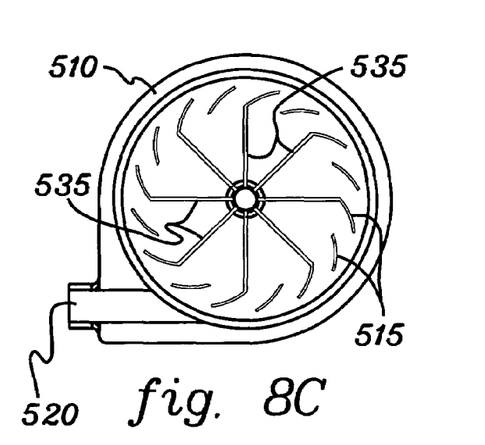
FIG. 8C is a cross-sectional plan view of the assembled coolant flow drive apparatus of FIG. 8A, taken along lines C-C, in accordance with an aspect of the present invention.
Figure 8D:
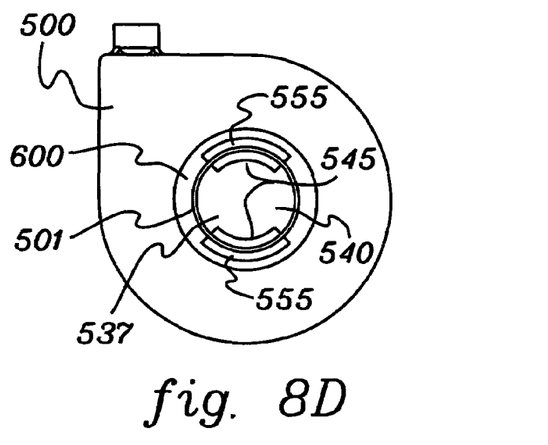
FIG. 8D is a cross-sectional plan view of the assembled coolant flow drive apparatus of FIG. 8A, taken along lines D-D, in accordance with an aspect of the present invention.
Figure 8E:
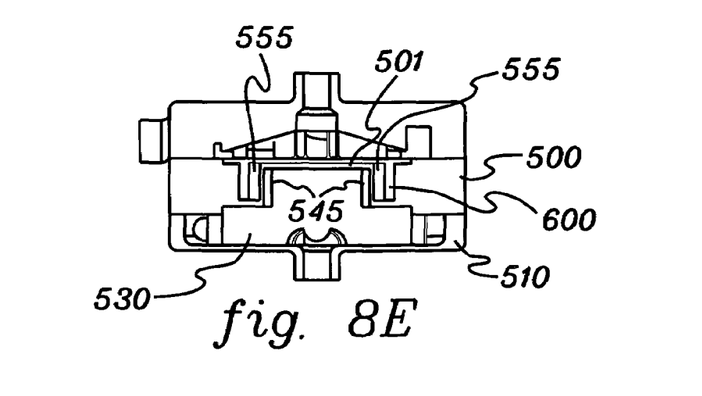
FIG. 8E is a cross-sectional elevational view of the assembled coolant flow drive apparatus of FIG. 8A, taken along lines E-E, in accordance with an aspect of the present invention.

FIG. 8B shows a representative geometry of the centrifugal pump cover 570 with the volute 610, and the impeller blades 595. Secondary coolant outlet 580 is also shown. The cross-sectional view of FIG. 8C shows a representative geometry of the radial flow hydraulic turbine cover 510 and impeller blades 535. As noted, turbine cover 510 includes turbine vanes 515 and a primary coolant inlet 520, with the coolant outlet aligned underneath the center axis of rotating impellers 535. FIG. 8D is a cross-sectional plan view taken through center chassis 500 to illustrate the relative positions of the pump side hub magnets 555 and turbine side hub magnets 545 to achieve the magnetic coupling. As shown, pump magnets 555 reside within pump impeller hub 600, while turbine side magnets 545 reside within turbine hub 537. The magnets are separated by a continuous magnetic coupling region 501 of the center chassis 500. FIG. 8E illustrates the sealing property of center chassis 500. As shown, the magnetic coupling area of turbine hub 537 of turbine 410 is a cylindrical protrusion that resides in a complementary pocket in center chassis 500, and the impeller hub 600 of the pump forms a ring that resides in an annular pocket in center chassis 500. The center chassis is thin in the magnetic coupling region 501, allowing the magnets on the turbine hub to be in close proximity to the magnets on the pump hub, without creating potential leakage sites that might allow the primary coolant flow to contaminate the secondary coolant flow.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A coolant flow drive apparatus for a cooling system comprising:
 a turbine in fluid communication with a primary coolant flowing within a primary coolant flow path;
 a pump in fluid communication with a secondary coolant within a secondary coolant flow path, the secondary coolant flow path being separate from the primary coolant flow path; and a magnetic coupling between the turbine and the pump, wherein the turbine drives the pump through the magnetic coupling, to pump secondary coolant through the secondary coolant flow path.

2. The coolant flow drive apparatus of claim 1, further comprising a center chassis separating the turbine in fluid communication with the primary coolant and the pump in fluid communication with the secondary coolant, wherein the center chassis comprises a seal-less, non-magnetic structure.

3. The coolant flow drive apparatus of claim 2, wherein the center chassis further comprises a solid region across which the magnetic coupling occurs between the turbine and the pump.

4. The coolant flow drive apparatus of claim 3, wherein the turbine further comprises a turbine impeller and the pump further comprises a pump impeller and wherein the magnetic coupling comprises first permanent magnets associated with the turbine impeller and second permanent magnets associated with the pump impeller.

5. The coolant flow drive apparatus of claim 1, wherein the turbine comprises a hydraulic radial flow turbine and the pump comprises a centrifugal pump.

6. The coolant flow drive apparatus of claim 1, wherein the primary coolant and the secondary coolant differ by at least one characteristic, the at least one characteristic comprising at least one of: coolant purity; coolant pressure; coolant flow rate; coolant phase change temperature; and coolant chemistry.

7. A cooling apparatus comprising:
a primary coolant flow path and a separate, secondary coolant flow path, the secondary coolant flow path facilitating removal of heat to the primary coolant flow path from a cooling structure coupled to a heat generating electronics component; and
a coolant flow drive apparatus coupled between the primary coolant flow path and the secondary coolant flow path, the coolant flow drive apparatus maintaining isolation of primary coolant in the primary coolant flow path and secondary coolant in the secondary coolant flow path, and transferring fluid flow energy from primary coolant flowing within the primary coolant flow path to the secondary coolant to pump the secondary coolant through the secondary coolant flow path.

8. The cooling apparatus of claim 7, wherein the coolant flow drive apparatus comprises:
a turbine in fluid communication with primary coolant flowing within the primary coolant flow path;
a pump in fluid communication with secondary coolant within the secondary coolant flow path; and
a magnetic coupling between the turbine and the pump, wherein the turbine drives the pump through the magnetic coupling to pump secondary coolant through the secondary coolant flow path.

9. The cooling apparatus of claim 8, wherein the coolant flow drive apparatus further comprises a center chassis separating the turbine in fluid communication with the primary coolant and the pump in fluid communication with the secondary coolant, the center chassis comprising a seal-less, non-magnetic structure.

10. The cooling apparatus of claim 9, wherein the center chassis further comprises a solid region across which the magnetic coupling occurs between the turbine and the pump.

11. The cooling apparatus of claim 10, wherein the magnetic coupling further comprises first permanent magnets associated with an impeller of the turbine, and second permanent magnets associated with an impeller of the pump, the first permanent magnets and the second permanent magnets magnetically coupling across the solid region of the center chassis.

12. The cooling apparatus of claim 8, wherein the turbine comprises a hydraulic radial flow turbine, and the pump comprises a centrifugal pump.

13. The cooling apparatus of claim 7, wherein the primary coolant and the secondary coolant differ by at least one characteristic, the at least one characteristic comprising at least one of: coolant purity; coolant pressure; coolant flow rate; coolant phase change temperature; and coolant chemistry.

14. The cooling apparatus of claim 7, wherein the cooling structure comprises a micro-scaled cooling structure.

15. A cooled electronics system comprising:
at least one electronics rack comprising a plurality of electronics subsystems; and
a cooling apparatus for at least one electronics subsystem of the plurality of electronics subsystems, the cooling apparatus comprising:
a primary coolant flow path and a separate, secondary coolant flow path, the secondary coolant flow path facilitating removal of heat to the primary coolant flow path from a cooling structure coupled to a heat generating electronics component within the at least one electronics subsystem; and
a coolant flow drive apparatus coupled between the primary coolant flow path and the secondary coolant flow path, the coolant flow drive apparatus maintaining isolation of primary coolant in the primary coolant flow path and secondary coolant in the secondary coolant flow path, and transferring fluid flow energy from primary coolant flowing within the primary coolant flow path to the secondary coolant to pump the secondary coolant through the secondary coolant flow path.

16. The cooled electronics system of claim 15, wherein the cooling structure comprises a micro-scaled cooling structure coupled to the heat generating electronics component.

17. The cooled electronics system of claim 15, wherein the coolant flow drive apparatus comprises:
a turbine in fluid communication with primary coolant flowing within the primary coolant flow path;
a pump in fluid communication with secondary coolant within the secondary fluid flow path; and
a magnetic coupling between the turbine and the pump, wherein the turbine drives the pump through the magnetic coupling to pump secondary coolant through the secondary flow path.

18. The cooled electronics system of claim 17, wherein the coolant flow drive apparatus further comprises a center chassis separating the turbine and the pump, the center chassis comprising a seal-less non-magnetic structure.

19. The cooled electronics system of claim 18, wherein the center chassis comprises a solid region, and wherein the magnetic coupling comprises first permanent magnets associated with an impeller of the turbine and second permanent magnets associated with an impeller of the pump, wherein the first permanent magnets and the second permanent magnets magnetically couple across the solid region of the center chassis.

20. The cooled electronics system of claim 17, wherein the turbine comprises a hydraulic radial flow turbine, and the pump comprises a centrifugal pump.

* * * * *